US006381704B1

United States Patent
Cano et al.

(10) Patent No.: US 6,381,704 B1
(45) Date of Patent: Apr. 30, 2002

(54) METHOD AND APPARATUS FOR ALTERING TIMING RELATIONSHIPS OF NON-OVERLAPPING CLOCK SIGNALS IN A MICROPROCESSOR

(75) Inventors: Francisco A. Cano; Rajib Nag, both of Missouri City; Robert E. Farrell, Murphy, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/240,271

(22) Filed: Jan. 29, 1999

Related U.S. Application Data (60) Provisional application No. 60/072,953, filed on Jan. 29, 1998.

(51) Int. Cl.[7] .................................................. G06F 1/04
(52) U.S. Cl. .................... 713/600; 713/400; 713/500; 710/58; 714/731
(58) Field of Search ........................ 713/400, 401, 713/500, 502, 503, 600, 601; 712/31; 710/58–61, 25; 709/400; 714/707, 731

(56) References Cited

U.S. PATENT DOCUMENTS

| | | | | |
|---|---|---|---|---|
| 4,512,030 A | * | 4/1985 | Fukuta | 377/107 |
| 4,864,579 A | * | 9/1989 | Kishida et al. | 371/22.3 |
| 5,041,738 A | | 8/1991 | Walters, Jr. | 307/269 |
| 5,072,418 A | | 12/1991 | Boutaud et al. | 364/715.06 |
| 5,089,955 A | * | 2/1992 | Morinaga et al. | 395/800 |
| 5,172,011 A | * | 12/1992 | Leuthold et al. | 307/272.2 |
| 5,323,403 A | * | 6/1994 | Elliott | 371/37.6 |
| 5,329,471 A | | 7/1994 | Swoboda et al. | 364/578 |
| 5,453,707 A | | 9/1995 | Hiratsuka et al. | 326/97 |
| 5,717,700 A | * | 2/1998 | Crouch et al. | 371/22.3 |
| 5,812,562 A | * | 9/1998 | Baeg | 371/22.31 |
| 5,867,049 A | * | 2/1999 | Mohd | 327/200 |
| 5,907,692 A | * | 5/1999 | Wise et al. | 712/201 |
| 5,952,863 A | * | 9/1999 | Jones et al. | 327/295 |
| 6,163,194 A | * | 12/2000 | Truong et al. | 327/259 |

FOREIGN PATENT DOCUMENTS

| | | | |
|---|---|---|---|
| JP | 63-155488 | 6/1988 | H03K/5/13 |
| JP | 64-240951 | 9/1989 | H03K/5/15 |

OTHER PUBLICATIONS

S/N: 08/762,169 (TI docket No. TI–24698), not included.
S/N 09/012,813 (TI docket No. TI–25311), not included.
S/N 08/391,992 (TI docket No. TI–19122), not included.

\* cited by examiner

*Primary Examiner*—Jeffrey Gaffin
*Assistant Examiner*—Rijue Mai
(74) *Attorney, Agent, or Firm*—Gerald E. Laws; W. James Brady, III; Frederick J. Telecky, Jr.

(57) ABSTRACT

A clock generation circuit 122 with a selectable non-overlap time period is described for use on an integrated circuit. A master clock signal M which has a latching edge is formed in response to a reference clock signal fclk. A slave clock signal S which has a driving edge is also formed in response to the reference clock signal. The driving edge of slave clock S is delayed by a non-overlap feedback path 504 so that the driving edge is delayed by the non-overlap time period after the latching edge of master clock M. The value of the non-overlap time period is selected by switching delay circuitry 531 in or out of the non-overlap feedback path on signal line 504. A control signal STRSTST is set high or low to select the value of the non-overlap time period. A sense circuit 561 or a scan latch 562 also can select the non-overlap time period.

19 Claims, 5 Drawing Sheets

METHOD AND APPARATUS FOR ALTERING TIMING RELATIONSHIPS OF NON-OVERLAPPING CLOCK SIGNALS IN A MICROPROCESSOR

This application claims priority under 35 USC §119(e)(1) of Provisional Application Number 60/072,953, filed Jan. 29, 1998.

FIELD OF THE INVENTION

This invention relates to digital integrated circuits which use non-overlapping clock signals, and more particularly to altering timing relationships of clock signals in a microprocessor, particularly during testing of the microprocessor.

BACKGROUND OF THE INVENTION

During the process of creating a new integrated circuit design, a circuit is typically designed and validated by simulation, a layout of the circuit is created, masks are made, and a prototype integrated circuit is fabricated. At this point, some of the prototype circuits are tested. Occasionally, a prototype part will not be completely functional due to a timing problem within the integrated circuit. If the timing problem creates a set-up or a hold time failure in one or more latch circuits, then the prototype circuit may be difficult or impossible to completely test.

In another case, two or more design teams may be contributing portions of a circuit design to form a complete, complex integrated circuit. One team may use a library of pre-designed circuits to design a portion of the integrated circuit, and another team may use a different library of pre-designed circuits to design a different portion of the integrated circuit. If the two different design libraries have different timing parameter assumptions, then the prototype part may be inoperable.

In yet another case, it may be desirable to operate an integrated circuit at temperatures or voltages that are outside of the intended operating range. In such an environment, circuit timing constraints often render an integrated circuit inoperable.

An object of the present invention is to provide a way to overcome setup and hold time problems in a prototype integrated circuit.

Another object of the present invention is to provide a way to overcome set-up and hold time problems during extended range operation of an integrated circuit.

Other objects and advantages will be apparent to those of ordinary skill in the art having reference to the following figures and specification.

SUMMARY OF THE INVENTION

In general, and in a form of the present invention, a method for operating an integrated circuit that has a plurality of latches which operate in response to set of non-overlapping clock signals, is provided. A non-overlap time value is selected by setting a control signal to a first value. An internal master clock signal is formed in response to an input clock signal. The master clock is used to latch registers within the integrated circuit. An internal slave clock is formed in a non-overlapping manner and used for driving signals from the internal registers. The driving edge of the slave clock is delayed from the latching edge of the slave clock in accordance with the non-overlap time parameter.

In another form of the present invention, a second value for non-overlap time is selected by setting the control signal to a second value.

Other embodiments of the present invention will be evident from the description and drawings.

BRIEF DESCRIPTION OF THE DRAWINGS

Other features and advantages of the present invention will become apparent by reference to the following detailed description when considered in conjunction with the accompanying drawings, in which.

DETAILED DESCRIPTION OF PREFERRED EMBODIMENTS OF THE INVENTION

Figure 1:
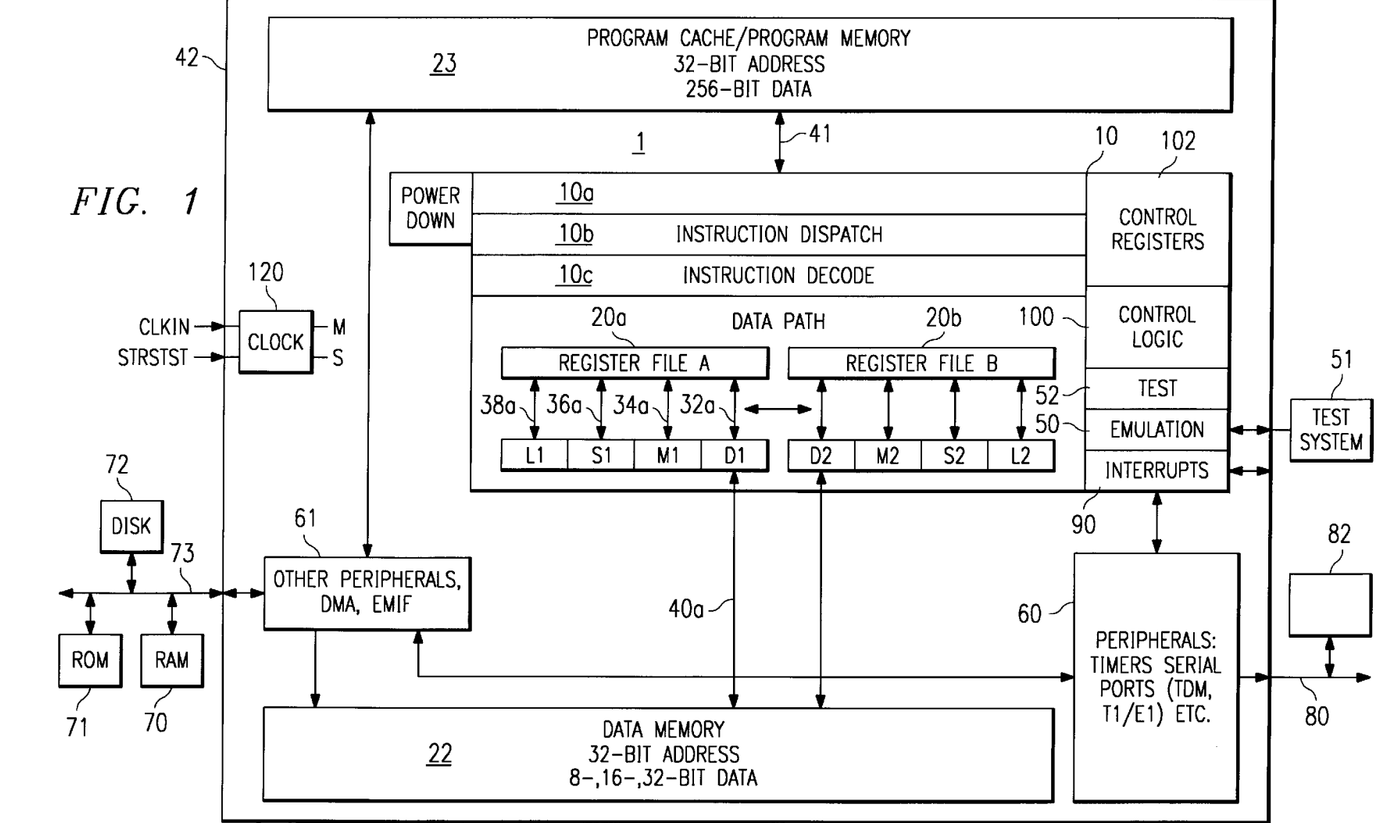
FIG. 1 is a block diagram of a digital signal processor (DSP), showing components thereof pertinent to an embodiment of the present invention.

FIG. 1 is a block diagram of a microprocessor 1 which has an embodiment of the present invention. Microprocessor 1 is a VLIW digital signal processor ("DSP"). In the interest of clarity, FIG. 1 only shows those portions of microprocessor 1 that are relevant to an understanding of an embodiment of the present invention. Details of general construction for DSPs are well known, and may be found readily elsewhere. For example, U.S. Pat. No. 5,072,418 issued to Frederick Boutaud, et al, describes a DSP in detail and is incorporated herein by reference. U.S. Pat. No. 5,329,471 issued to Gary Swoboda, et al, describes in detail how to test and emulate a DSP and is incorporated herein by reference. Details of portions of microprocessor 1 relevant to an embodiment of the present invention are explained in sufficient detail hereinbelow, so as to enable one of ordinary skill in the microprocessor art to make and use the invention.

A detailed description of various architectural features of the microprocessor of FIG. 1 is provided in co-assigned application Ser. No. 09/012,813 (TI-25311) and is incorporated herein by reference. A description of a complete set of instructions for the microprocessor of FIG. 1 is also provided in co-assigned application Ser. No. 09/012,813 (TI-25311) and is incorporated herein by reference.

In microprocessor 1 there are shown a central processing unit (CPU) 10, data memory 22, program memory 23, peripherals 60 and an external memory interface (EMIF) with a direct memory access (DMA) 61. CPU 10 further has an instruction fetch/decode unit 10a–c, a plurality of execution units, including an arithmetic and load/store unit D1, a multiplier M1, an ALU/shifter unit S1, an arithmetic logic unit ("ALU") L1, a shared multiport register file 20a from which data are read and to which data are written. Decoded instructions are provided from the instruction fetch/decode unit 10a–c to the functional units D1, M1 S1, and L1 over various sets of control lines which are not shown. Data are provided to/from the register file 20a from/to to load/store units D1 over a first set of busses 32a, to multiplier M1 over a second set of busses 34a, to ALU/shifter unit S1 over a third set of busses 36a and to ALU L1 over a fourth set of busses 38a. Data are provided to/from the memory 22 from/to the load/store units D1 via a fifth set of busses 40a. Note that the entire data path described above is duplicated with register file 20b and execution units D2, M2, S2, and L2. Instructions are fetched by fetch unit 10a from instruction memory 23 over a set of busses 41. Emulation circuitry 50 provides access to the internal operation of integrated circuit 1 which can be controlled by an external test/development system (XDS) 51.

External test system 51 is representative of a variety of known test systems for debugging and emulating integrated circuits. One such system is described in U.S. Pat. No. 5,535,331 which is incorporated herein by reference. Test circuitry 52 contains control registers and parallel signature analysis circuitry for testing integrated circuit 1.

Note that the memory 22 and memory 23 are shown in FIG. 1 to be a part of a microprocessor 1 integrated circuit, the extent of which is represented by the box 42. The memories 22–23 could just as well be external to the microprocessor 1 integrated circuit 42, or part of it could reside on the integrated circuit 42 and part of it be external to the integrated circuit 42. These are matters of design choice. Also, the particular selection and number of execution units are a matter of design choice, and are not critical to the invention.

When microprocessor 1 is incorporated in a data processing system, additional memory or peripherals may be connected to microprocessor 1, as illustrated in FIG. 1. For example, Random Access Memory (RAM) 70, a Read Only Memory (ROM) 71 and a Disk 72 are shown connected via an external bus 73. Bus 73 is connected to the External Memory Interface which is part of functional block 61 within microprocessor 42. A Direct Memory Access (DMA) controller is also included within block 61. The DMA controller is generally used to move data between memory and peripherals within microprocessor 1 and memory and peripherals which are external to microprocessor 1.

Still referring to FIG. 1, an external clock signal CLKIN is connected to clock circuit 120 to provide a clock signal reference. Clock circuit 120 forms a master clock signal M and a non-overlapping slave clock signal S. A control signal STRSTST is also connected to clock circuit 120, according to an aspect of the present invention, in order to select a value for the amount of non-overlap between the master clock M and the slave clock S.

Figure 2:
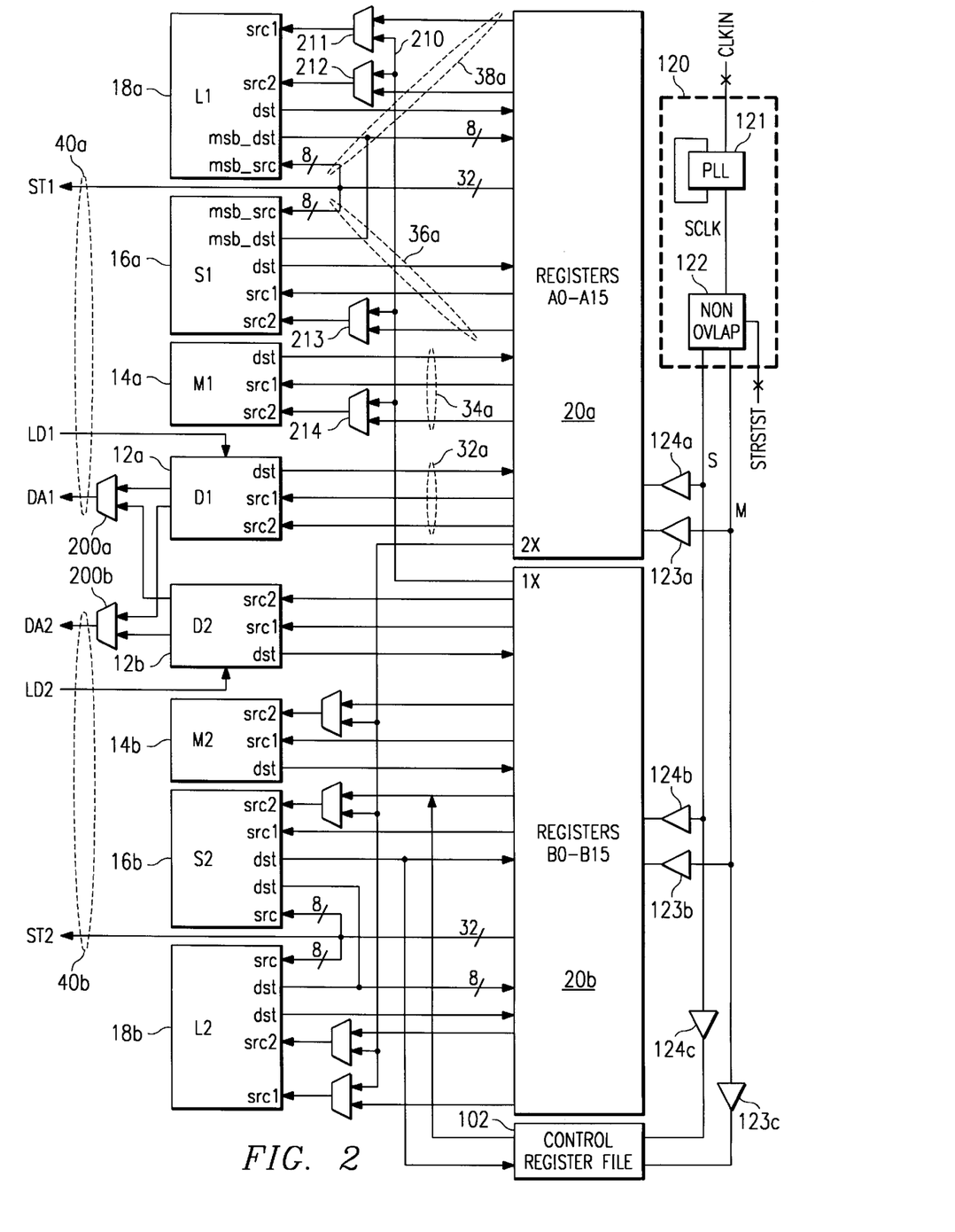
FIG. 2 is a block diagram of the functional units, data paths and register files of FIG. 1.

FIG. 2 is a block diagram of the execution units and register files of the microprocessor of FIG. 1 and shows a more detailed view of the buses connecting the various functional blocks. In this figure, all data busses are 32 bits wide, unless otherwise noted. Bus 40a has an address bus DA1 which is driven by mux 200a. This allows an address generated by either load/store unit D1 or D2 to provide an address for loads or stores for register file 20a. Data Bus LD1 loads data from an address in memory 22 specified by address bus DA1 to a register in load unit D1. Unit D1 may manipulate the data provided prior to storing it in register file 20a. Likewise, data bus ST1 stores data from register file 20a to memory 22. Load/store unit D1 performs the following operations: 32-bit add, subtract, linear and circular address calculations. Load/store unit D2 operates similarly to unit D1, with the assistance of multiplexor 200b for selecting an address.

ALU unit L1 performs the following types of operations: 32/40 bit arithmetic and compare operations; left most 1, 0, bit counting for 32 bits; normalization count for 32 and 40 bits; and logical operations. ALU L1 has input src1 for a 32 bit source operand and input src2 for a second 32 bit source operand. Input msb_src is an 8 bit value used to form 40 bit source operands. ALU L1 has an output dst for a 32 bit destination operands. Output msb_dst is an 8 bit value used to form 40 bit destination operands. Two 32 bit registers in register file 20a are concatenated to hold a 40 bit operand. Multiplexor 211 is connected to input src1 and allows a 32 bit operand to be obtained from register file 20a via bus 38a or from register file 20b via bus 210. Multiplexor 212 is connected to input src2 and allows a 32 bit operand to be obtained from register file 20a via bus 38a or from register file 20b via bus 210. ALU unit L2 operates similarly to unit L1.

ALU/shifter unit S1 performs the following types of operations: 32 bit arithmetic operations; 32/40 bit shifts and 32 bit bit-field operations; 32 bit logical operations; branching; and constant generation. ALU S1 has input src1 for a 32 bit source operand and input src2 for a second 32 bit source operand. Input msb_src is an 8 bit value used to form 40 bit source operands. ALU S1 has an output dst for a 32 bit destination operands. Output msb_dst is an 8 bit value used to form 40 bit destination operands. Multiplexor 213 is connected to input src2 and allows a 32 bit operand to be obtained from register file 20a via bus 36a or from register file 20b via bus 210. ALU unit S2 operates similarly to unit S1, but can additionally perform register transfers to/from the control register file 102.

Multiplier M1 performs 16×16 multiplies. Multiplier M1 has input src1 for a 32 bit source operand and input src2 for a 32 bit source operand. ALU S1 has an output dst for a 32 bit destination operands. Multiplexor 214 is connected to input src2 and allows a 32 bit operand to be obtained from register file 20a via bus 34a or from register file 20b via bus 210. Multiplexor M2 operates similarly to multiplier M1.

Still referring to FIG. 2, clock circuit 120 is shown in more detail, with phase locked loop (PLL) circuit 121 for forming an internal clock signal referenced to external clock signal CLKIN. A non-overlap circuit 122 is connected to PLL 121 and forms master clock M and slave clock S. Control signal STRSTST is connected to non-overlap circuit 121, which will be described in detail in the following paragraphs. Master clock signal M is fanned out to various portions of DSP 1 and buffered by a set of clock buffers, represented by buffers 123a–123c. Likewise, slave clock signal S is fanned out and buffered by a set of clock buffers, represented by buffers 124a–124c.

Figure 3:
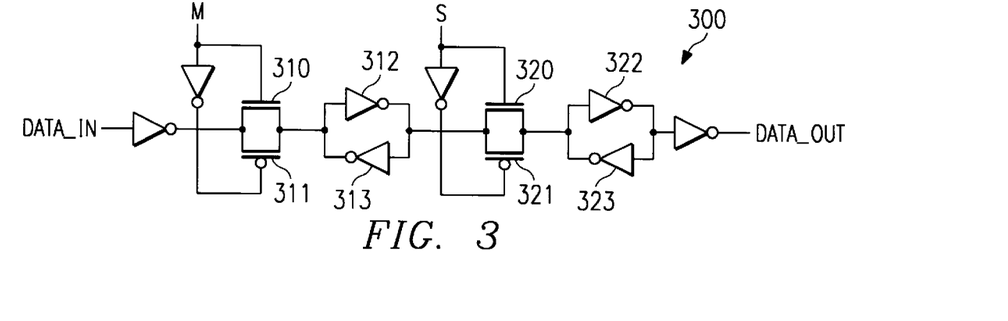
FIG. 3 is a schematic of a master slave storage circuit used in the DSP of FIG. 1.
Figure 4:
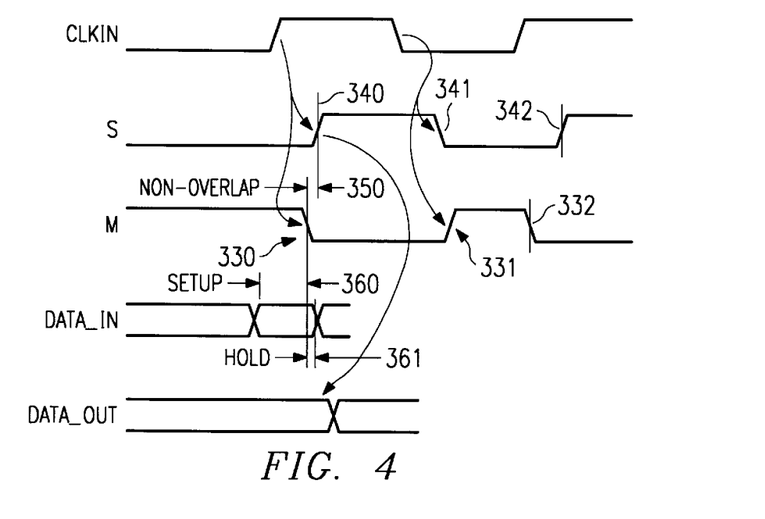
FIG. 4 is a timing diagram which illustrates the operation of the storage circuit of FIG. 3.

FIG. 3 is a schematic of a master slave storage circuit 300 used in DSP 1 of FIG. 1. Storage circuit 300 is representative of the various registers of DSP1, such as register file 20a, register file 20b and control registers 102, for example. FIG. 4 is a timing diagram which illustrates the operation of storage circuit 300. While master clock signal M is high, pass gates 310 and 311 are enabled to drive cross coupled inverters 312 and 313 to follow input signal DATA-IN. When master clock M transitions to a low signal at latching edge 330, pass gates 310 and 311 are disabled, and cross coupled inverters 312 and 313 retain the last value of DATA-IN. DATA-IN must be stable for a period of time 360, referred to as set-up time, prior to latching edge 330 in order for a correct value to be transferred to inverters 312–313. Likewise, DATA-IN must remain stable for a period of time 361 after latching edge 330 referred to as hold time. A short time later, slave signals transitions to a high signal at driving edge 340 and enables pass gates 320 and 321 to transfer the value latched by inverters 312–313 to cross coupled inverters 322 and 323. Signal DATA-OUT is driven in response to the value latched by inverters 322–323. Slave S transitions low at edge 341 and disables transfer gates 320–321. Inverters 322–323 continue to drive signal DATA-OUT. At edge 331, master M transitions high and enables a new value of DATA-IN to be transferred to inverters 312–313.

The amount of time between edge 330 and edge 340 is non-overlap time T1 350. This time is critical, because if T1 is too short, then signal DATA-OUT will transition too soon and cause a hold time failure in a second storage circuit (not shown) connected to storage circuit 300. If this time is too large, then time is wasted and DSP 1 operates slower than it could if time T1 was shorter. According to an aspect of the present invention, control signal STRSTST can be asserted to increase non-overlap time T1 to compensate for a storage circuit in which non-overlap time T1 is too short.

Figure 5:
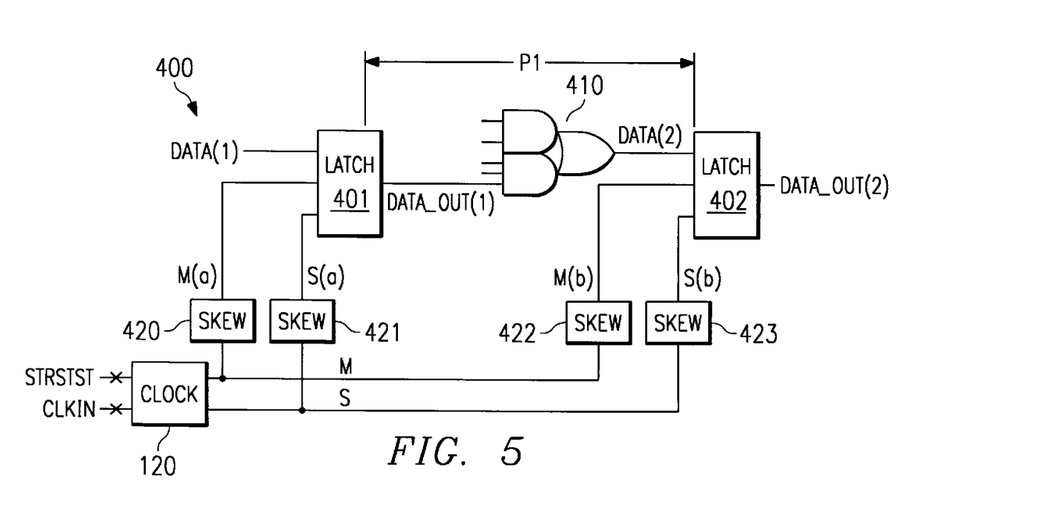
FIG. 5 is a block diagram of several latches within the DSP of FIG. 1, illustrating multiple sources of clock skew.

FIG. 5 is a block diagram of several latches within DSP 1 of FIG. 1, illustrating multiple sources of clock skew. Latch 401 and latch 402 are storage circuits similar to storage circuit 300 of FIG. 3. Latch 401 is representative of a variety of latches in DSP 1, such as a bit of register B1, for example. Likewise, latch 402 is representative of a variety of latches in DSP 1, such as a bit of register A15, for example. Combinational circuitry 410 is representative of circuitry which is connected between two latches, such as logic unit 18a, for example. Skew 420 and 421 are time delays that results from propagation delays in clock signal interconnect lines carrying master clock M and slave clock S to latch 401 and in clock buffers, such as 123b and 124b, for example. Likewise, skew 422 and 423 are time delays that results from propagation delays in clock signal interconnect lines carrying master clock M and slave clock S to latch 402 and in clock buffers, such as 123a and 124a, for example. Ideally, skews 420–423 are all equal so that non-overlap time T1 can be minimized. According to an aspect of the present invention, control signal STRSTST can be asserted to increase non-overlap time T1 to compensate for inequalities between skews 420–423.

Still referring to FIG. 5, inequalities in skews 420–423 can occur due to many reasons. For example, uncomprehended physical characteristics in clock signal lines may manifest themselves in a prototype part of DSP 1, such as signal line capacitance or load capacitance, for example. Faulty operation of buffers 123a–c or 124a–c may occur. A high voltage or high temperature environment may cause a non-linear variation in skews 420–423. Many other factors too numerous to mention can conspire to cause non-equality in skews 420–423.

Still referring to FIG. 5 and with reference to FIG. 4, correct operation of circuit 400 requires that after latching edge 340 of slave clock S, signal DATA_OUT(1) from latch 401 propagates through combinational circuitry 410 and arrive DATA(2) on the input of latch 402 in sufficient time to meet the set-up time for latch 402 before latching edge 332 of master clock M occurs. This time is represented as propagation time P1 in FIG. 5. DATA(2) must also remain stable long enough to meet the hold time for latch 402. The same factors that affect skews 420–423 can also affect other components of circuit 400, even if skews 420–423 maintain equality. According to an aspect of the present invention, control signal STRSTST can be asserted to increase non-overlap time T1 in combination with decreasing the frequency of external clock signal CLKIN to compensate for variations in P1.

Figure 6:
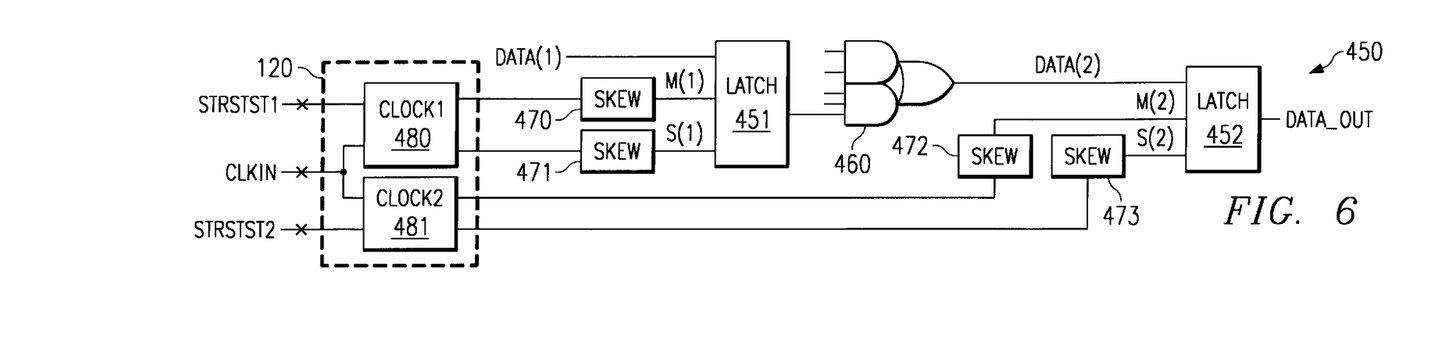
FIG. 6 is a block diagram of several latches within the DSP of FIG. 1, illustrating multiple internal clock generation circuits and multiple sources of clock skew.

FIG. 6 is a block diagram of several latches within an alterative embodiment of the DSP of FIG. 1, illustrating multiple internal clock generation circuits and multiple sources of clock skew. Clock generation circuitry 120 has two clock generation circuits 480 and 481, which form two independent sets of internal clock signals, M(1) and S(1), and M(2) and S(2). Clock generation circuit 480 provides clock signals to CPU 10, while clock generation circuit 481 provides clock signals to peripheral devices in block 60 and 61 of FIG. 1. Thus, latch 451 is representative of a variety of latches in CPU 10, such as a bit of register Al, for example. Likewise, latch 452 is representative of a variety of latches in the variety of peripherals, such as a timer in block 60, for example. Clock signal M(1) and S(1) are fanned out with a set of clock drivers that produce skews 470 and 471, as discussed above. Likewise, clock signals M(2) and S(2) are fanned out with a set of clock drivers that produce skews 472 and 473.

Still referring to FIG. 6, inequalities in skews 470–473 can occur due to many reasons, as discussed with reference to FIG. 5. For example, uncomprehended physical characteristics in clock signal lies may manifest themselves in a prototype part of DSP 1, such as signal line capacitance or load capacitance, for example. Faulty operation of buffers 123a–c or 124a–c may occur. A high voltage or high temperature environment may cause a non-linear variation in skews 470–473. Many other factors too numerous to mention can conspire to cause non-equality in skews 470–473. According to an aspect of the present invention, control signal STRSTST1 can be asserted to increase non-overlap time in clock generation circuit 480 to compensate for inequalities between skews 470–473. Likewise, control signal STRSTST2 can be asserted to increase non-overlap time in clock generation circuit 481 to compensate for inequalities between skews 470–473. Alternatively, a single STRSTST control signal can be connected to both clock circuits 480 and 481. Alternatively, a single STRSTST control signal can be connected to just one of clock generation circuits 480 or 481.

Figure 7:
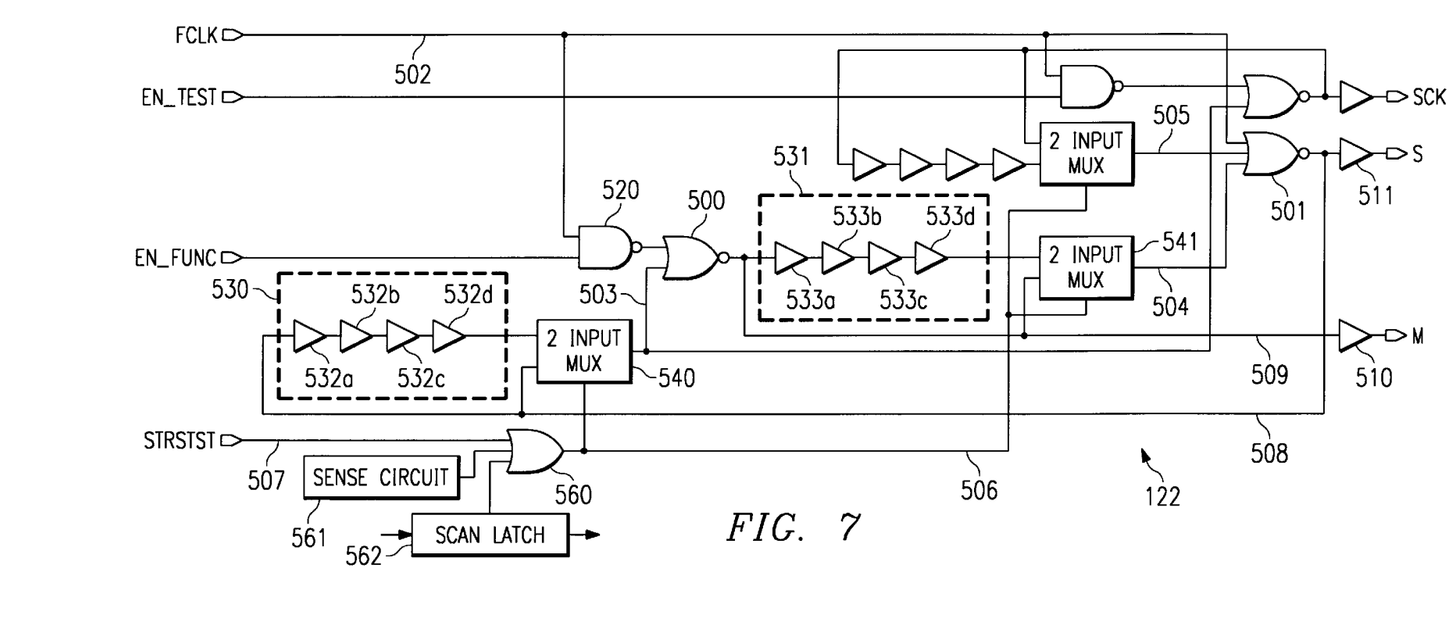
FIG. 7 is a schematic of a circuit for forming non-overlap clocks according to an aspect of the present invention.
Figure 8:
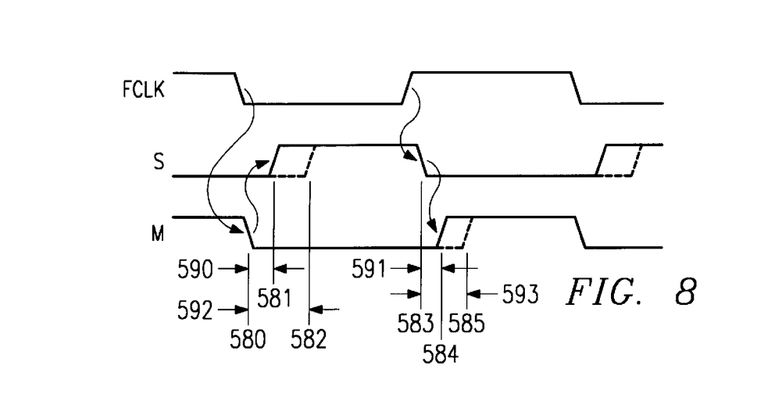
FIG. 8 is a timing diagram of non-overlapping clock signals formed according to aspects of the present invention.

FIG. 7 is a schematic of non-overlap circuit 122 for forming non-overlap clocks according to an aspect of the present invention. FIG. 8 is a timing diagram of non-overlapping clock signals M and S formed by non-overlap circuit 122. Functional clock signal fclk is received from PLL 121 (FIG. 2) on line 502 which connects to NOR gate 501 and NAND gate 520. When enabled by signal en_func, NAND gate 520 passes fclk to NOR gate 500. NOR gate 500 drives signal 509, which is buffered by buffer 510, low at time 580 to form a latching edge of clock signal M. NOR gate 501 drives 508, which is buffered by buffer 511, to form a low transition at time 583 on slave clock S. Signal 508 is also connected to NOR gate 500 via multiplexor 540 so that signal 509 is held low until slave clock S transitions low at time 583. Thus, master clock M does not transition high until time 584 due to the propagation time of multiplexor 540 and NOR gate 500; this produces non-overlap time 591. Likewise, signal 509 is connected to NOR gate 501 via multiplexor 541 so that signal 508 is held low until master clock M transitions low at time 580. Thus, slave clock S does not transition high until time 581 due to the propagation time of multiplexor 541 and NOR gate 501; this produces non-overlap time 590.

Control signal STRSTST is connected to multiplexor 540 and 541. When control signal STRSTST is asserted, delay circuit 530 is inserted in series with signal line 508 so that master clock M does not transition high until time 585 due to the extra delay of delay circuit 530. Likewise, delay circuit 531 is inserted in series with signal line 509 so that slave clock S does not transition high until time 582 due to the extra delay of delay circuit 531. Thus, according to an aspect of the present invention, a first non-overlap time 590 is selected by de-asserting control signal STRSTST. A second non-overlap time 592 is selected by asserting control signal STRSTST. Non-overlap time 592 is greater than non-overlap time 590, by approximately the amount of delay provided by delay circuit 530. Likewise, according to an aspect of the present invention, a first non-overlap time 591 is selected by de-asserting control signal STRSTST. A second non-overlap time 593 is selected by asserting control signal STRSTST. Non-overlap time 593 is greater than non-overlap time 591, by approximately the amount of delay provided by delay circuit 531.

Delay circuit 530 contains four buffers 531*a*–531*d* which act as delay elements. Likewise, delay circuit 531 contains four buffers 532*a*–532*d* acting as delay elements. In an another embodiment, either or both delay circuits may have more or fewer delay elements. Alternatively, delay elements 531*a*–*d* and/or delay elements 532*a*–*d* can be inverting buffers, serpentine track, or other known forms of delay.

As discussed above, control signal STRSTST is connected to multiplexors 540 and 541 to select different values of non-overlap time. During testing, integrated circuit 1 can be stress tested by elevating its operating voltage or its ambient temperature, or both. In such a stressful environment, it has been determined that timing skews within the circuitry of integrated circuit 1 may vary in non-linear ways so that integrated circuit 1 fails due to hold time failures which cannot be overcome by lowering the frequency of CLKIN, since clock signals M and S are generated internal to integrated circuit 1. Advantageously, according to an aspect of the present invention, control signal STRSTST can be set to select a longer non-overlap time so that integrated circuit 1 can operate correctly in the stressing environment.

Still referring to FIG. 7, sense circuit 561 provides an alternate means for forming a control signal. Sense circuit 561 senses the temperature of a substrate upon which integrated circuit 1 is formed. Below a selected substrate temperature, sense circuit 561 remains de-asserted. When the substrate temperature exceeds the selected temperature, then sense circuit 561 asserts an output signal that is or'ed with control signal STRSTST via OR gate 560, and provides the same function as control signal STRSTST. Alternatively, sense circuit 561 senses an operating voltage of integrated circuit 1 and becomes asserted when the operating voltage exceeds a predetermined value. Alternatively, sense circuit 561 can sense other parameters that could cause integrated circuit 1 to fail due to hold time failures. Advantageously, sense circuit 561 can be useful during factory testing of integrated circuit 1 and also during operation of integrated circuit 1 in a deployed system that must operate in stressful environmental conditions.

Still referring to FIG. 7, scan latch 562 provides a control signal to OR gate 560 for selecting a non-overlap time in response to a bit that is scanned in from test system 51. Aspects of testing with scan chains are fully described in U.S. Pat. No. 5,329,471, which has been incorporated herein by reference.

Alternative embodiments of integrated circuit 1 can have any one or all of control signal STRSTST, sense circuit 561 and/or scan latch 562. Furthermore, other means of setting a control signal, such as a bit in a control register in control register file 102, a memory mapped register bit, etc., can be used to form a control signal that is placed on signal line 506.

Figure 9:
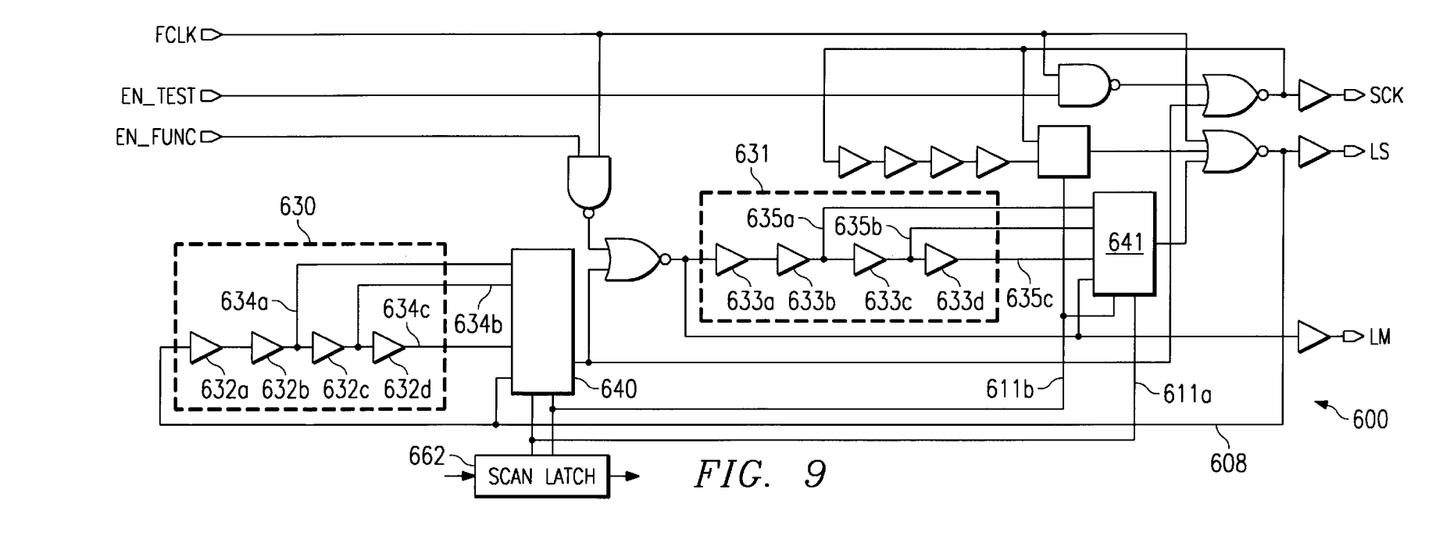
FIG. 9 is a schematic of a circuit for forming non-overlap clocks with more than two non-overlap choices, according to another aspect of the present invention.

FIG. 9 is a schematic of a circuit for forming non-overlap clocks with more than two non-overlap choices, according to another aspect of the present invention. Scan latch 662 has two bits which are connected to control signal lines 611*a* and 611*b* and is operational to store an index value that is output on control lines 611*a*–*b*. Multiplexor 640 is controlled by the index value on signal lines 611*a* and 611*b*. Non-overlap circuit 600 operates similarly to non-overlap circuit 122, except the delay element 630 has several taps 633*a*–633*c* that can be selected by multiplexor 640 in response to control signals 611*a*–*b*. An another embodiment, the index value can be greater than two bits and correspondingly more delay taps could be selected.

Figure 10:
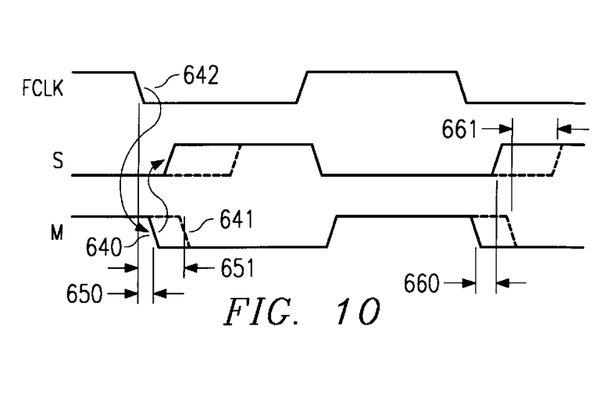
FIG. 10 is a timing diagram of non-overlapping clock signals formed according to another aspect of the present invention.

FIG. 10 is a timing diagram of another embodiment of non-overlapping clock signals formed according to another aspect of the present invention. When a first control signal value is selected, a latching edge 640 of master clock M is formed in response to a falling edge 642 of clock signal fclk, such that a delay time 650 exists between reference clock fclk and latching edge 641. When a second control signal value is selected, the latching edge of master clock M is delayed until time 641, such that a delay time 651 exists. Similar to FIG. 8, when the first control signal value is selected, non-overlap time 660 is formed; and when the second control signal value is selected, non-overlap time 661 is formed. Referring again to FIG. 6, an embodiment of circuit 450 with a clock generation circuit 480 and/or 481 which operates according to FIG. 10 advantageously allows a latching edge of clock M(1) to be shifted with respect to a latching edge of clock M(2) in order to compensate for unequal skews 470 and 472 so that a timing margin in integrated circuit 1 is improved.

Fabrication of data processing device 1 involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

An alternative embodiment of the novel aspects of the present invention may include other circuitry's which are combined with the circuitry's disclosed herein in order to reduce the total gate count of the combined functions. Since those skilled in the art are aware of techniques for gate minimization, the details of such an embodiment will not be described herein.

An advantage of the present invention is that an integrated circuit can be stress tested at an elevated temperature or at an elevated voltage and by selecting a longer non-overlap time the probability of successful operation is improved. Thus, test yields can be improved. It has been determined that burn-in testing of an integrated circuit can by reduced or eliminated if the integrated circuit operates correctly in a stressed environment.

Another advantage of the present invention is that in some cases it is desirable to operate an integrated circuit in a stressed environment. Aspects of the present invention allow timing parameters internal to the integrated circuit to be modified in order to accommodate operation in a stressed environment.

Another advantage of the present invention is that a prototype part that is failing due to hold time failures can be made functional by selecting a longer non-overlap time period. This can allow a debug procedure to continue, or it could allow prototype parts to be shipped and operated with the longer non-overlap time value.

Another advantage of the present invention is the amount of additional non-overlap time can be pre-selected to be any percentage of the period of the reference clock signal that is less than the pulse width of the slave clock signal.

Another advantage of the present invention is that the latching edge of the master clock signal can be varied with reference to the external input clock signal.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method for operating an integrated circuit, wherein the integrated circuit has a plurality of latches which operate in response to set of non-overlapping clock signals, the method comprising:

selecting a first non-overlap time by setting a control signal to a first value;

forming a first clock signal of the set of non-overlapping clock signals internally to the integrated circuit in response to an input clock signal, the first clock signal having a latching edge;

forming a second clock signal of the set of non-overlapping clock signals internally to the integrated circuit in response to the input clock signal, the second clock having a driving edge, wherein the driving edge is delayed by the first non-overlap time after the latching edge;

latching a data value in a first latch of the plurality of latches in response to the latching edge of the first clock signal to form a latched data value; and driving the latched data value from the first latch in response to the driving edge of the second clock signal.

2. The method of claim 1, further comprising:

selecting a second non-overlap time by setting the control signal to a second value; and wherein the step of forming a second clock signal delays the driving edge by the second non-overlap time after the latching edge, whereby a timing margin in the integrated circuit is improved by selecting the second non-overlap time.

3. The method of claim 2, wherein the second non-overlap time is greater than the first non-overlap time; and further comprising:

stressing the integrated circuit by heating it to an elevated temperature; and testing the integrated circuit for correct operation while the integrated circuit is stressed and while the second non-overlap time is selected, whereby test yield is improved in response to greater non-overlap time.

4. The method of claim 2, wherein the second non-overlap time is greater than the first non-overlap time; and further comprising:

stressing the integrated circuit by setting a supply voltage of the integrated circuit to a test voltage value; and testing the integrated circuit for correct operation while the integrated circuit is stressed and while the second non-overlap time is selected.

5. The method of claim 2, wherein the step of forming a first clock forms the latching edge at a first preselected time after a rising edge of the input clock signal when the first non-overlap time is selected and at a second preselected time after the rising edge of the input clock when the second non-overlap time is selected.

6. The method of claim 1, wherein the step of selecting a first non-overlap value is responsive to a control signal placed on an external pin of the integrated circuit.

7. The method of claim 1, wherein the step of selecting a first non-overlap value further comprises scanning a data value representative of the control signal into a scan latch within the integrated circuit.

8. The method of claim 1, wherein the step of selecting a first non-overlap value further comprises sensing a supply voltage of the integrated circuit and forming the control signal in response to the supply voltage.

9. The method of claim 1, wherein the step of selecting a first non-overlap value further comprises sensing a substrate temperature of the integrated circuit and forming the control signal in response to the substrate temperature.

10. The method of claim 2, wherein the step of selecting a second non-overlap value further comprises storing a delay value index in a memory circuit to select from a plurality of second non-overlap values.

11. An integrated circuit, wherein the integrated circuit has a plurality of latches which operate in response to set of non-overlapping clock signals, further comprising:

circuitry for selecting a first non-overlap time in response to a control signal having a first value;

circuitry for forming a first clock signal of the set of non-overlapping clock signals internally to the integrated circuit in response to an input clock signal, the first clock signal having a latching edge;

circuitry for forming a second clock signal of the set of non-overlapping clock signals internally to the integrated circuit in response to the input clock signal, the second clock having a driving edge, wherein the driving edge is delayed by the first non-overlap time after the latching edge;

a first latch of the plurality of latches is connected to the first clock signal and is operable to latch a first data value in response to the latching edge of the first clock signal to form a latched data value; and the first latch is connected to the second clock signal and is operable to drive the latched data value from the first latch in response to the driving edge of the second clock signal.

12. The integrated circuit of claim 11, further comprising:

circuitry for selecting a second non-overlap time in response to the control signal having a second value; and wherein the circuitry for forming the second clock signal is operable to delay the driving edge by the second non-overlap time after the latching edge, whereby a timing margin in the integrated circuit is improved by selecting the second non-overlap time.

13. The integrated circuit of claim 12, wherein the circuitry for forming a first clock is operable to form the latching edge at a first preselected time after a rising edge of the input clock signal when the first non-overlap time is selected and at a second preselected time after the rising edge of the input clock when the second non-overlap time is selected.

14. The integrated circuit of claim 11, further comprising an external pin connected to the circuitry for selecting operable to provide the control signal.

15. The integrated circuit of claim 11, further comprising a scan latch connected to the circuitry for selecting, the scan latch being operable to provide the control signal.

16. The integrated circuit of claim 11, further comprising circuitry for sensing a supply voltage connected to the circuitry for selecting, the circuitry for sensing being operable to sense a supply voltage of the integrated circuit and to form the control signal in response to the supply voltage.

17. The integrated circuit of claim 11, further comprising circuitry for sensing a substrate temperature connected to the circuitry for selecting, the circuitry for sensing being operable to sense a substrate temperature of the integrated circuit and to form the control signal in response to the substrate temperature.

18. The integrated circuit of claim 12, further comprising circuitry for storing a delay index value connected to the circuitry for selecting, the circuitry for storing being operable to store an index value and to select from a plurality of second non-overlap values in response to the index value.

19. The integrated circuit of claim 12, further comprising:
circuitry for forming a third clock signal of the set of non-overlapping clock signals internally to the integrated circuit in response to the input clock signal, the third clock signal having a latching edge;
circuitry for forming a fourth clock signal of the set of non-overlapping clock signals internally to the integrated circuit in response to the input clock signal, the fourth clock having a driving edge, wherein the driving edge of the fourth clock signal is delayed by a third non-overlap time after the latching edge of the third clock signal;
a second latch of the plurality of latches is connected to the third clock signal and is operable to latch a second data value in response to the latching edge of the third clock signal to form a second latched data value; and
the second latch is connected to the fourth clock signal and is operable to drive the second latched data value from the second latch in response to the driving edge of the fourth clock signal, whereby a hold time of the first latch is adjusted by the second non-overlap time to be compatible with a setup time of the second latch.

* * * * *